United States Patent
Hongkham et al.

(10) Patent No.: US 9,524,889 B2
(45) Date of Patent: *Dec. 20, 2016

(54) PROCESSING SYSTEMS AND APPARATUS ADAPTED TO PROCESS SUBSTRATES IN ELECTRONIC DEVICE MANUFACTURING

(71) Applicant: Applied Materials, Inc., Santa Clara, CA (US)

(72) Inventors: Steve S. Hongkham, San Ramon, CA (US); Paul B. Reuter, Austin, TX (US); Eric A. Englhardt, Palo Alto, CA (US); Ganesh Balasubramanian, Fremont, CA (US); Xinglong Chen, San Jose, CA (US); JuanCarlos Rocha-Alvarez, San Carlos, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/202,763

(22) Filed: Mar. 10, 2014

(65) Prior Publication Data

US 2014/0263165 A1      Sep. 18, 2014

Related U.S. Application Data

(60) Provisional application No. 61/788,825, filed on Mar. 15, 2013.

(51) Int. Cl.
  *B01J 19/00*    (2006.01)
  *H01L 21/67*    (2006.01)

(52) U.S. Cl.
  CPC .... *H01L 21/67184* (2013.01); *Y10T 137/0318* (2015.04); *Y10T 137/86187* (2015.04)

(58) Field of Classification Search
  CPC ................................................. H01L 21/67184
  See application file for complete search history.

(56) References Cited

U.S. PATENT DOCUMENTS

| 5,855,681 A | 1/1999 | Maydan et al. |
| 5,951,770 A | 9/1999 | Perlov et al. |
| (Continued) | | |

FOREIGN PATENT DOCUMENTS

| JP | 2001-160578 | 6/2001 |
| JP | 2006-253629 | 9/2006 |
| JP | 2012-253348 | 12/2012 |

OTHER PUBLICATIONS

International Search Report and Written Opinion of International Application No. PCT/US2014/022656 mailed Jun. 26, 2014.

(Continued)

*Primary Examiner* — Parviz Hassanzadeh
*Assistant Examiner* — Nathan K Ford
(74) *Attorney, Agent, or Firm* — Dugan & Dugan, PC

(57) ABSTRACT

A via pass-through apparatus is disclosed. The via pass-through apparatus includes a pass-through chamber adapted to couple between a first mainframe section and a second mainframe section of a substrate processing system, the pass-through chamber including an entry and an exit each having a slit valve, and a via process chamber located at a different level than the pass-through chamber wherein the via process chamber is adapted to carry out a process on a substrate at the via location. Systems and methods of operating the system are provided, as are numerous other aspects.

12 Claims, 9 Drawing Sheets

(56) References Cited

U.S. PATENT DOCUMENTS

| | | |
|---|---|---|
| 6,173,938 B1 | 1/2001 | McAndrew |
| 6,182,376 B1 * | 2/2001 | Shin .................. H01L 21/67109 |
| | | 34/412 |
| 6,287,386 B1 | 9/2001 | Perlov et al. |
| 6,347,918 B1 | 2/2002 | Blahnik |
| 6,468,353 B1 | 10/2002 | Perlov et al. |
| 6,575,737 B1 | 6/2003 | Perlov et al. |
| 6,656,840 B2 | 12/2003 | Rajagopalan et al. |
| 6,734,102 B2 | 5/2004 | Rathi et al. |
| 6,764,265 B2 | 7/2004 | Kunze et al. |
| 6,916,397 B2 | 7/2005 | Pfeiffer et al. |
| 6,946,401 B2 | 9/2005 | Huang et al. |
| 7,007,919 B2 | 3/2006 | Blonigan et al. |
| 7,658,802 B2 | 2/2010 | Fu et al. |
| 7,720,655 B2 | 5/2010 | Rice |
| 8,293,016 B2 | 10/2012 | Bahng et al. |
| 2002/0170672 A1 | 11/2002 | Perlov et al. |
| 2005/0072716 A1 | 4/2005 | Quiles et al. |
| 2007/0020890 A1 * | 1/2007 | Thakur ............. H01L 21/67207 |
| | | 438/478 |
| 2009/0108544 A1 | 4/2009 | Sico et al. |
| 2010/0288728 A1 * | 11/2010 | Han ........................ H01J 37/20 |
| | | 216/41 |
| 2012/0264291 A1 | 10/2012 | Ganguli et al. |
| 2012/0322015 A1 * | 12/2012 | Kim .................................. 432/1 |
| 2013/0026135 A1 * | 1/2013 | Kim ................................ 216/58 |

OTHER PUBLICATIONS

Merry et al., U.S. Appl. No. 14/180,954, titled: "Semiconductor Device Manufacturing Platform With Single and Twinned Processing Chambers," filed Feb. 14, 2014.

Reuter et al., U.S. Appl. No. 14/203,098, titled: "Process Load Lock Apparatus, Lift Assemblies, Electronic Device Processing Systems, and Methods of Processing Substrates in Load Lock Locations," filed Mar. 10, 2014.

International Preliminary Report on Patentability and Written Opinion of International Application No. PCT/US2014/022656 mailed Sep. 24, 2015.

\* cited by examiner

PROCESSING SYSTEMS AND APPARATUS ADAPTED TO PROCESS SUBSTRATES IN ELECTRONIC DEVICE MANUFACTURING

RELATED APPLICATIONS

The present application claims priority to U.S. Provisional Application 61/788,825 filed Mar. 15, 2013, and entitled "PROCESSING SYSTEMS, APPARATUS, AND METHODS ADAPTED TO PROCESS SUBSTRATES IN ELECTRONIC DEVICE MANUFACTURING", which is hereby incorporated herein for all purposes.

FIELD

The present invention relates to electronic device manufacturing, and more specifically to processing systems, apparatus, and methods adapted to process substrates.

BACKGROUND

Conventional electronic device manufacturing systems may include multiple process chambers and one or more load lock chambers surrounding a transfer chamber. These systems may employ a transfer robot housed within the transfer chamber that is adapted to transport substrates between the various process chambers and one or more load lock chambers.

In order to add additional process capability within a particular tool, in other embodiments, two mainframe sections may be linked together and substrates may be passed through between the two mainframe sections by one or more pass-through chambers. The two mainframe sections may be operated at two different vacuum levels in some embodiments. A factory interface may be provided and operate to load substrates into and out of the one or more load lock chambers.

However, in some instances, the additional processing that is added by the addition of a second mainframe section may still be insufficient for the processing desired on the substrate at a specific tool. Enlarging the size of the mainframe sections is at the expense of added floor space requirements, which may not always be available. Moreover, enlarging the size of the mainframe may require a complete redesign of the mainframe body and even the transfer robot. Accordingly, improved processing systems, apparatus, and methods enabling higher throughput and processing capacity are desired.

SUMMARY

In a first aspect, a via pass-through apparatus is provided. Via pass-through apparatus includes a pass-through chamber adapted to couple between a first mainframe section and a second mainframe section, the pass-through chamber including an entry and an exit each having a slit valve, and a via process chamber located at a different level than the pass-through chamber, wherein the via process chamber is adapted to carry out a process on a substrate.

According to another aspect, an electronic device processing system is provided. The electronic device processing system includes a first mainframe section including a first robot configured to move substrates, a second mainframe section including a second robot configured to move substrates, and a via pass-through apparatus coupled between the first mainframe and the second mainframe, the via pass-through apparatus including a first pass-through chamber coupled between the first mainframe and the second mainframe, wherein the first pass-through chamber is accessible by both the first robot and the second robot, and a via process chamber adapted to carry out a process on a substrate, the via process chamber located at a different level than the first pass-through chamber.

In another aspect, a method of processing substrates is provided. The method includes providing a first mainframe section including a first robot, providing a second mainframe section adjacent to the first mainframe section including a second robot, providing a via pass-through apparatus coupling the first mainframe and second mainframe, and carrying out processing on one or more substrates in the via processing chamber of the via pass-through apparatus.

Numerous other features are provided in accordance with these and other aspects of the invention. Other features and aspects of the present invention will become more fully apparent from the following detailed description, the appended claims and the accompanying drawings.

DETAILED DESCRIPTION

Electronic device manufacturing may desire not only very precise and rapid transport of substrates between various locations, but may desire additional processing capability within a fixed space envelope (e.g., a fixed floor area). In particular, many existing systems include a first and second mainframes connected by pass-through chambers. Robots received in the transfer chambers of these mainframes may have one or more end effectors adapted to transport substrates resting upon the end effectors to and from process chambers of the substrate processing system, and may be interactive to move substrates through the pass-throughs between the mainframe sections. In some instances, single end effectors are used. However, dual end effectors, sometimes referred to as "dual blades," may be attached at an end of the robot and used to speed up substrate transfer and swapping. Conventional selective compliance assembly robot arm (SCARA) robots may be used, or robots having independently actuated members may be used to enable access into offset facets of each mainframe.

In such two-mainframe systems, mainframe sections have been linked together in order to enlarge the number of process chambers that are available and that may be used for processing at a particular tool. The pass-through chambers between the two mainframe sections typically have slit valves on either side to isolate the two mainframe sections, which may be operated at different vacuum levels, or may be undergoing different processing warranting separation.

However, even with the addition of a second mainframe section, process capability may be limited. In many instances, additional processing capability is desired, yet enlarging the size of the mainframe sections may be difficult for reasons discussed above. Accordingly, processing systems having increased processing capability without substantially increased floor space footprint size are desired. Moreover, it is desired that the mainframe sections require minimal modifications.

In order to provide increased process capability in a substrate processing system having a footprint that is substantially the same as existing dual mainframe systems (sometimes referred to as "dual buffer systems"), according to one or more embodiments of the present invention, an improved substrate processing system is provided. The improved substrate processing system provides additional process capability co-located at the physical location of the one or more via pass-throughs. For example, the via processing chambers may be provided directly above the via pass through chambers. Via pass-through apparatus including such processing capability are described herein.

Further details of example embodiments of various embodiments of the invention are described with reference to FIGS. 1-5 herein.

Figure 1:
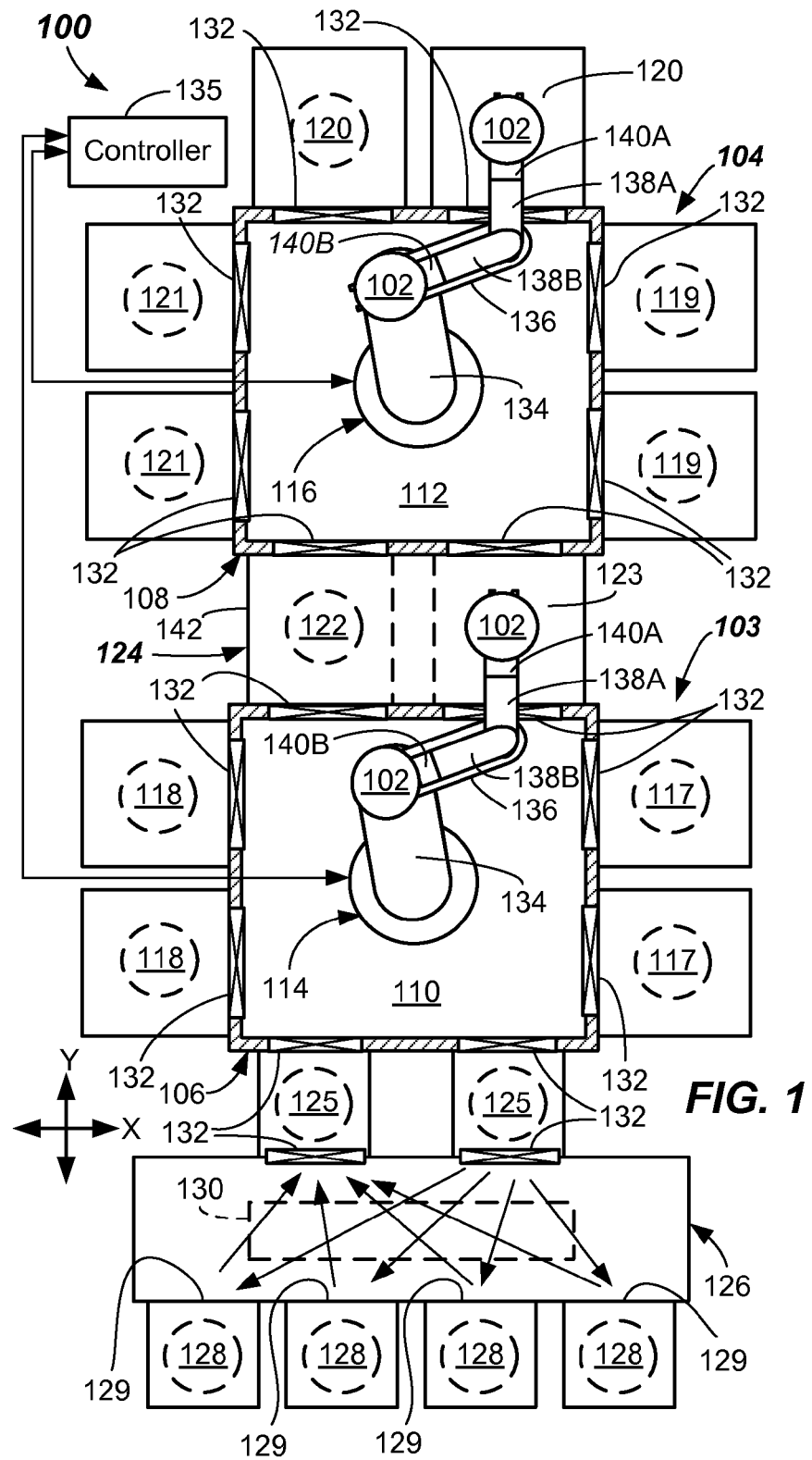
FIG. 1 illustrates a schematic top view of a substrate processing system including multiple mainframe sections wherein additional processing capability is provided in a via pass-through apparatus coupled between the mainframe sections at the via location according to embodiments.

Referring now to FIG. 1, an example of an electronic device processing system 100 according to embodiments of the present invention is disclosed. The electronic device processing system 100 is useful to carry out one or more processes on a substrate 102. For example, the substrate 102 may be a patterned or unpatterned semiconductor wafer, glass plate or panel, polymer substrate, reticule, mask, or the like. In some embodiments, the substrate may be a silicon wafer, which may be an electronic device precursor such as an incomplete semiconductor wafer having one or more layers, patterns, or a plurality of incomplete chips formed thereon.

The electronic device processing system 100 includes a first mainframe section 103 provided adjacent to a second mainframe section 104. Each mainframe section 103, 104 includes a section housing 106, 108, respectively, and each includes a transfer chamber 110, 112 therein. The section housings 106, 108 may include a number of vertical side walls, which may be defined by chamber facets, as well as top and bottom walls. In the depicted embodiment, the section housings 106, 108 include twined facets, wherein the facets on each side wall are substantially parallel to one another, i.e., the entry directions into the respective twinned chambers coupled to the facets may be substantially co-parallel, albeit they may be slightly angled. Each of the transfer chambers 110, 112 are defined by the side walls thereof as well as the top and bottom walls, and may be maintained at a vacuum, for example. The vacuum level for each transfer chamber 110, 112 may be the same or different.

First and second robots 114, 116 are received in the respective first and second transfer chambers 110, 112 and each robot includes arms and one or more end effectors that are adapted to be operable thereon to support and transport substrates 105. The first and second robots 114, 116 may be adapted to pick or place substrates 102 (e.g., a "semiconductor wafer" shown in FIG. 1 as solid circles) to or from a destination. The destination may be any chamber coupled to the first or second transfer chambers 110, 112. For example, the destination may be one or more first process chambers 117 or second process chambers 118 coupled to the first housing 106 that are accessed from the first transfer chamber 110, one or more third process chambers 119, fourth process chambers 120, or fifth process chambers 121 that are all coupled to the second housing 108 and accessible from the second transfer chamber 112, one or more load lock chambers 125 that may be coupled to the first housing 106 and accessible from the first transfer chamber 110, and a via pass-through apparatus 124. The via pass-through apparatus 124 will be described in more detail below, but comprises a combination of processing capability and pass-through capability at the "via location." "Via location" as used herein means a location between the first and second mainframe sections 103, 104 that is accessible by both the robots 114, 116.

Process chambers 117-121, and the process chambers of the via pass-through apparatus 124 may be adapted to carry out any number of processes or process steps on the substrates 102, such as deposition, oxidation, oxide removal, nitration, etching, cleaning, abatement, and the like. In one or more embodiments, the abatement may include halide removal. In another embodiment, the oxide removal may be a copper oxide removal. Any of the above processes may be carried out within via pass-through apparatus 124.

The one or more load lock chambers 125 may be adapted to interface with a factory interface 126 that may receive substrates 102 from substrate carriers 128 (e.g., Front Opening Unified Pods (FOUPs)) that may be docked at load ports 129 of the factory interface 126. A load/unload robot 130 (shown dotted) may be used to transfer substrates 102 between the substrate carriers 128 and the load lock chambers 125 as shown by arrows. Transfers may be carried out in any order or direction. One or more conventional slit valves 132 may be provided at the entrance to each process chamber 117-121, load lock chambers 125, and the via pass-through apparatus 124.

Again referring to FIG. 1, each robot 114, 116 may include a base adapted to be attached to a wall (e.g., a bottom floor) of the respective first and second housing 106, 108 forming a part of the transfer chambers 110, 112. Each robot 114, 116 may include any suitable multi-arm configuration adapted to transport substrates 102 between the mainframe sections 103, 104 and the one or more load lock chambers 125. For example, the robots 114, 116 may include multiple arms and may be identical. Robots 114, 116 may include an upper arm 134 which, in the depicted embodiment, may be a substantially rigid cantilever beam. The upper arm 134 may be adapted to be independently rotated about a shoulder rotational axis in either a clockwise or counterclockwise rotational direction. The rotation about shoulder rotational axis may be provided by any suitable motive member, such as upper arm drive motor that may be received in a motor housing (not shown) positioned outside of each transfer chamber 110, 112, such as a conventional variable reluctance or permanent magnet electric motor mounted below the bottom floor. The rotation of the upper arms 134 may be controlled by suitable commands to the upper arm drive motor from a controller 135. In some embodiments, the motor housing and base may be made integral with one another. In other embodiments, the base may be made integral with the bottom floor of the transfer chamber 110, 112.

Mounted and rotationally coupled at an outboard end of the upper arm 134, at a radial position spaced from the shoulder rotational axis, is a forearm 136. The forearm 136 may be adapted to be rotated in an X-Y plane relative to the upper arm 134 about an elbow rotational axis at the radial position. The forearm 136 may be independently rotatable in the X-Y plane relative to the base and the upper arm 134 by a forearm drive motor (not shown), which may be provided in a motor housing (also not shown).

Located on an outboard end of the forearm 136 at a position spaced from the elbow rotational axis may be one or more wrist members 138A, 138B. The wrist members 138A, 138B may each be adapted for independent rotation in the X-Y plane relative to the forearm 136 about a wrist rotational axis. Furthermore, the wrist members 138A, 138B may each couple to end effectors 140A, 140B (otherwise referred to as a "blades"), wherein the end effectors 140A, 140B are each adapted to carry and transport a substrate 102 during pick and/or place operations. The end effectors 140A, 140B may be of any suitable conventional construction. The end effectors 140A, 140B may be passive or may include some active means for holding the substrate 102 such as a mechanical clamp or electrostatic capability. The end effectors 140A, 140B may be coupled to the wrist members 138A, 138B by any suitable means such as mechanical fastening, adhering, clamping, and the like. Optionally, the respective wrist members 138A, 138B and end effectors 140A, 140B may be coupled to each other by being formed as one integral piece. Rotation of each wrist member 138A, 138B may be imparted by respective wrist drive motors that may located in a motor housing (not shown) that may be outside of the transfer chambers 110, 112.

In the depicted embodiment, the end effectors 140A, 140B may be inserted into each process chamber 117-121, each of the one or more via pass-through chambers 122, 123, and each chamber of the via pass-through apparatus 124. The insertion may be in a generally straight-on manner, i.e., inserted in a direction substantially perpendicular to the facet of the respective chamber, albeit some slight angular offset may be allowed as well. This ability to access parallel faceted (e.g., twinned chambers) is referred to herein as off-axis capability because the line of action of the end effectors 140A, 104B upon insertion and retraction is horizontally offset from the shoulder axis of the respective robot 114, 116.

Other types of robots may be used to service such off-axis or twinned chambers, such as the robot taught in U.S. Pat. No. 5,855,681 to Maydan et al. In the depicted embodiment, the one or more via pass-through chambers 122, 123 are coupled to the first mainframe section 103 on a side of the first mainframe section 103 that is horizontally opposite from the via pass-through apparatus 124. The pass-through apparatus 124 may be configured as individual component and may include an common body 142 that is attachable to each mainframe section 103, 104.

Figure 2:
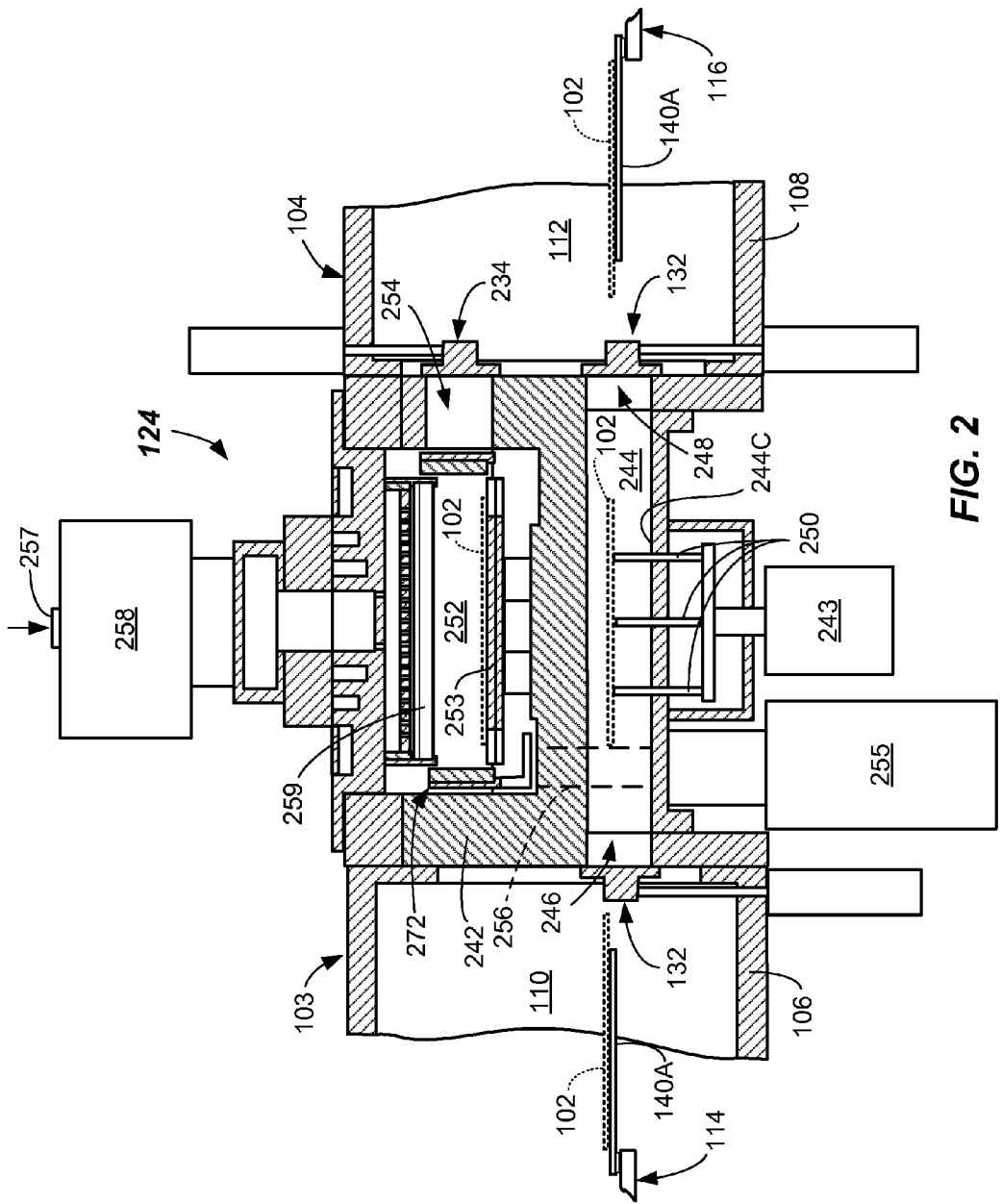
FIG. 2 illustrates a partial cross-sectioned side view of a first via pass-through apparatus according to embodiments.

FIG. 2 illustrates details of a representative via pass-through apparatus 124 according to embodiments. The via pass-through apparatus 124 includes a common body 242 of rigid material (e.g., aluminum) connectable to the first housing 106 of the first mainframe section 103 on a first side and to the second housing 108 of the second mainframe section 104 on the other side. Connection may be by way of a mechanical connection such as by fastening (e.g., bolting) or the like and the connection interfaces with the first and second housings 106, 108 may be suitably sealed in some embodiments.

The via apparatus 124 includes a pass-through chamber 244 adapted to couple between a first mainframe section 103 and a second mainframe section 104 and allow substrates 102 to be passed through between the transfer chambers 110, 112. Pass-through chamber 244 includes an entry 246 and an exit 248, each having a slit valve 132. Entry and exit as used herein are not conclusively indicative of direction, and the entry 246 may function as an exit at times. Likewise, the exit 248 may function as an entry at times. Accordingly, substrates 102 may pass-through the pass-through chamber 244 in either direction. Slit valves 132 may be any suitable slit valve construction, such as taught in U.S. Pat. Nos. 6,173, 938; 6,347,918; and 7,007,919. In some embodiments, the slit valves 132 may be L-motion slit valves, for example.

The pass-through chamber 244 may be of conventional construction, and may include one or more supports 250 adapted to allow one or more substrates 102 (one shown dotted) to be placed and supported thereon. Substrates 102 placed on the one or more supports 250 are accessible by each robot 114, 116 by extending the end effectors 140A, 140B through the respective entry 246 and exit 248. Supports 250 may be made of any suitable construction, such as pins, pedestals, slots, tabs, platforms, or the like. In some embodiments, a lift actuator 243 may be used to lift the one or more supports 250.

The via pass-through apparatus 124 further includes a via process chamber 252. Via process chamber 252 is located at a different vertical level than the pass-through chamber 244. Via process chamber 252 is adapted to carry out a process on a substrate 102 that is placed therein. In this manner, additional processing capability for the substrate processing system 100 is provided at the via location. In the depicted embodiment, at least portions of the chambers 244, 252 are formed in the common body 242. In the depicted embodiment, Z-axis capability may be provided on the robots 114, 116 in order to service the pass-through chamber 244 and the via process chamber 252 located at two vertical levels. The Z-axis capability may be up to about 200 mm. Cooling may take place within the pass-through chamber 244 by lowering the substrate 102 onto a cool down 244C. Vacuum provided to the via pass-through chamber 244 may be provided by a dedicated vacuum pump (not shown).

In the depicted embodiment, the via process chamber 252 is arranged and positioned vertically above (e.g., directly above) the pass-through chamber 244. In the depicted embodiment, the entryway into the process chamber 252 is through an opening 254 communicating with the second transfer chamber 112 of the second mainframe section 104. A slit valve 234 may be provided at the opening 254. The via pass-through apparatus 124 may have a single opening 254 into the via process chamber 252 in some embodiments.

Figure 3:
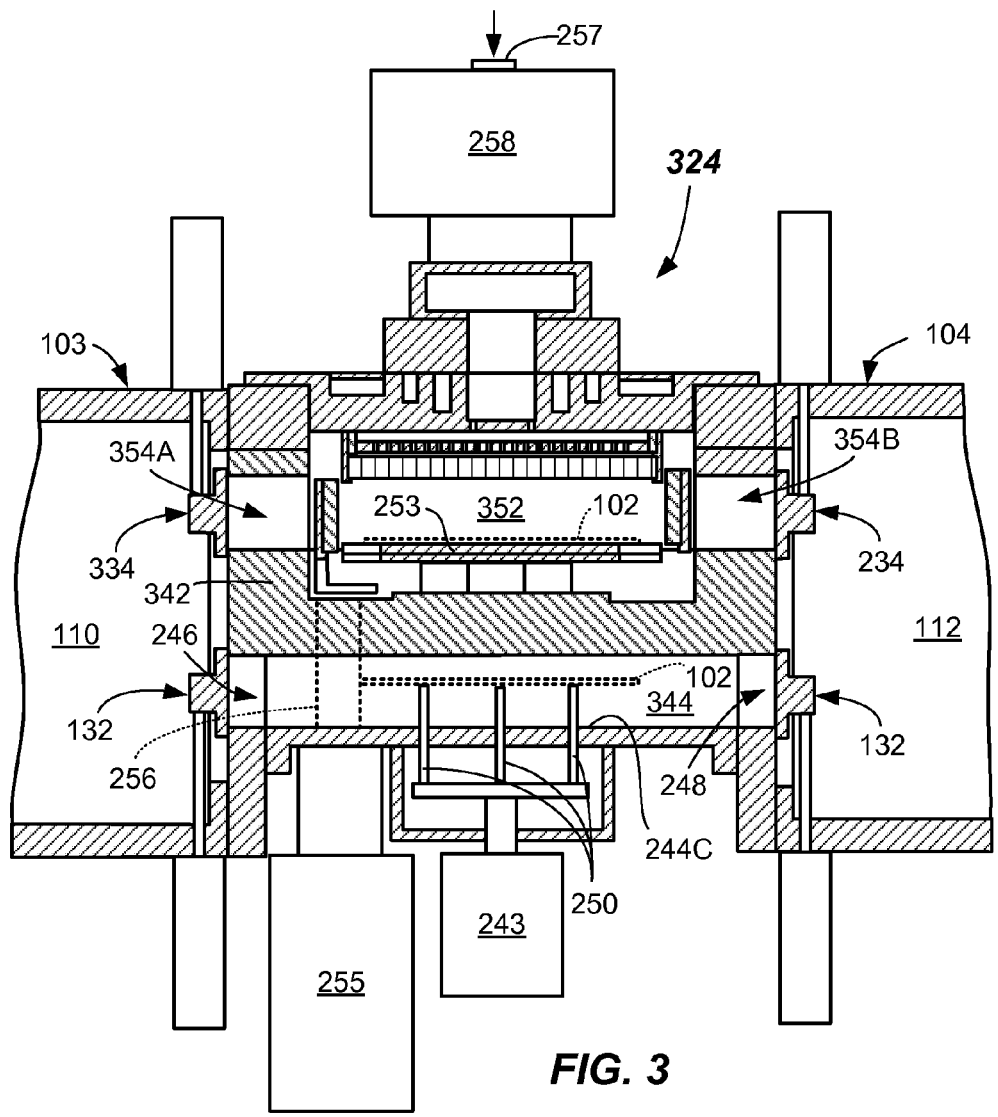
FIG. 3 illustrates a cross-sectioned side view of an alternate via pass-through apparatus according to embodiments.

The embodiment of FIG. 3 provides an alternative embodiment of a via pass-through apparatus 324 having a pass-through chamber 344 and a via process chamber 352 located and positioned vertically above the pass-through chamber 344, but where multiple openings 354A, 354B are provided into the via process chamber 352. Slit valves 132, 234, 334 may be provided at each opening 354A, 354B and entry 246 and exit 248. Thus, openings 354A and 354B and entry 246 and exit 248 may each be used to pass and transfer substrates 102 through between the transfer chambers 110, 112. Thus, pass-through capability is provided through the via process chamber 352 in this embodiment. The via process chamber 352 has a first opening 354A adapted to couple to, and be accessible from, the first transfer chamber 110 of the first mainframe section 103, and a second opening 354B adapted to couple to, and be accessible from, the second transfer chamber 112 of the second mainframe section 104.

Now referring to both FIGS. 2 and 3, the via process chambers 252, 352 may each include a pedestal 253 upon which a substrate 102 to be processed may be supported during processing. The pedestal 253 may be a stationary (e.g., immovable) pedestal and may be heated in some embodiments, such as by including a conventional resistance heater therein. The heater may be functional to heat the substrate 102 to a predefined temperature, such as between about 0 degrees C. and 300 degrees C., and above about 250 degrees C. in some embodiments, and between about 280 degrees C. and about 300 degrees C. in further embodiments. The pass-through apparatus 124, 324 may carry out a process on the substrate 102 in the via process chambers 252, 352 of the via pass-through apparatus 124, 324. In particular, the process carried out in the via process chambers 252, 352 may be at least one selected from a group of processes consisting of a deposition process, an oxidation process, a nitration process, an annealing process, an etching process, a cleaning process, or an abatement process. In one embodiment, the process may be an oxide removal or oxide etching process adapted to remove copper oxide (CuO), for example. In some embodiments, the process may be a plasma-assisted process.

In other embodiments, the process carried out in the via process chambers 252, 352 may be an abatement process adapted to remove a halogen component from the substrate 102. For example, an abatement process for removal of halogen-containing residues may take place in the via process chambers 252, 352. Abatement may be carried out to remove one or more of hydrogen bromide (HBr), chlorine ($Cl_2$), or carbon tetrafluoride ($CF_4$). A suitable abatement process for removal of halogen-containing residues is taught in U.S. Pat. No. 8,293,016, for example. Other post-processing residues may be removed in the via process chambers 252, 352. For example, substrates 102 may undergo a process in one of the process chambers (e.g., 117-121 and then be transported by the respective robot 114, 116 to the via process chambers 252, 352 for a residue removal process or other gas abatement process.

The vacuum pressure in the via process chambers 252, 352 may be controlled by a coupled vacuum pump 255 to a suitable vacuum range suitable for carrying out the desired process thereat. The vacuum pump 255 may be a turbo pump or other suitable pump and may be coupled to each chambers 252, 352 by one or more passages 256 internal to the common body 242, 342. The pump 255 may operate to provide the vacuum for each process chamber 252, 352.

One or more gases may be supplied to the via process chambers 252, 352 via gas inlet 257 into the common remote plasma source 258. 257, 357 to carry out the desired process. For example, gases such as nitrogen ($N_2$), Argon (Ar), helium (He), Hydrogen (H2) Oxygen ($O_2$), ozone ($O_3$) and the like may be supplied to the via process chambers 252, 352 by conventional gas supply systems (not shown). Such gas supply systems may include gas supply vessels, mass flow controllers and valves, for example.

In another embodiment, a copper oxide removal process may take place in the via process chambers 252, 352. A suitable copper oxide removal process is described in U.S. Pat. Nos. 6,734,102 and 6,946,401, for example. Other copper oxide removal processes may be used. In some processes, a plasma source 258, such as the common remote plasma source shown, may be provided and coupled to the via process chambers 252, 352.

Figure 4A:
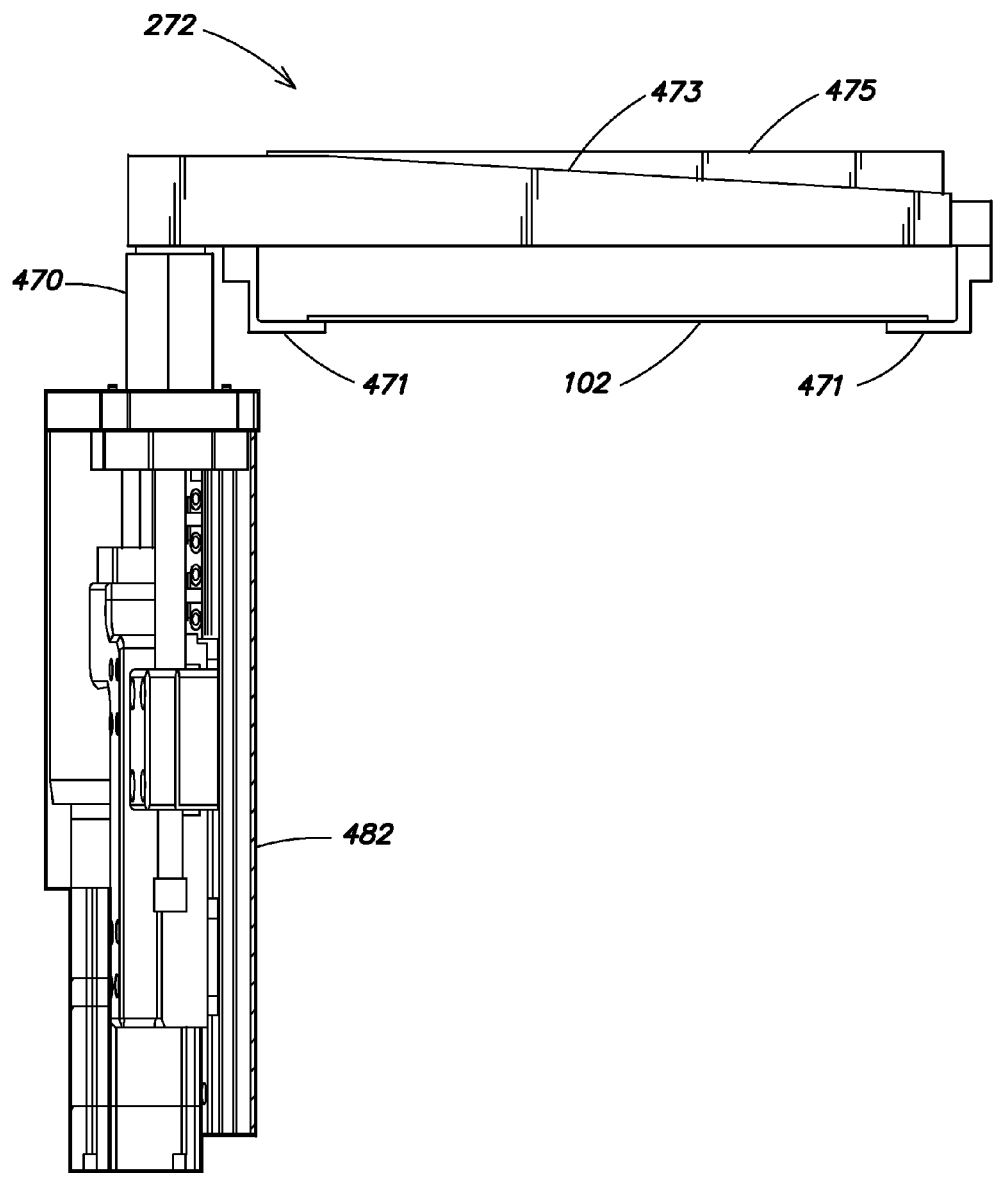
FIG. 4A illustrates a side plan view of a lift assembly according to embodiments.
Figure 4B:
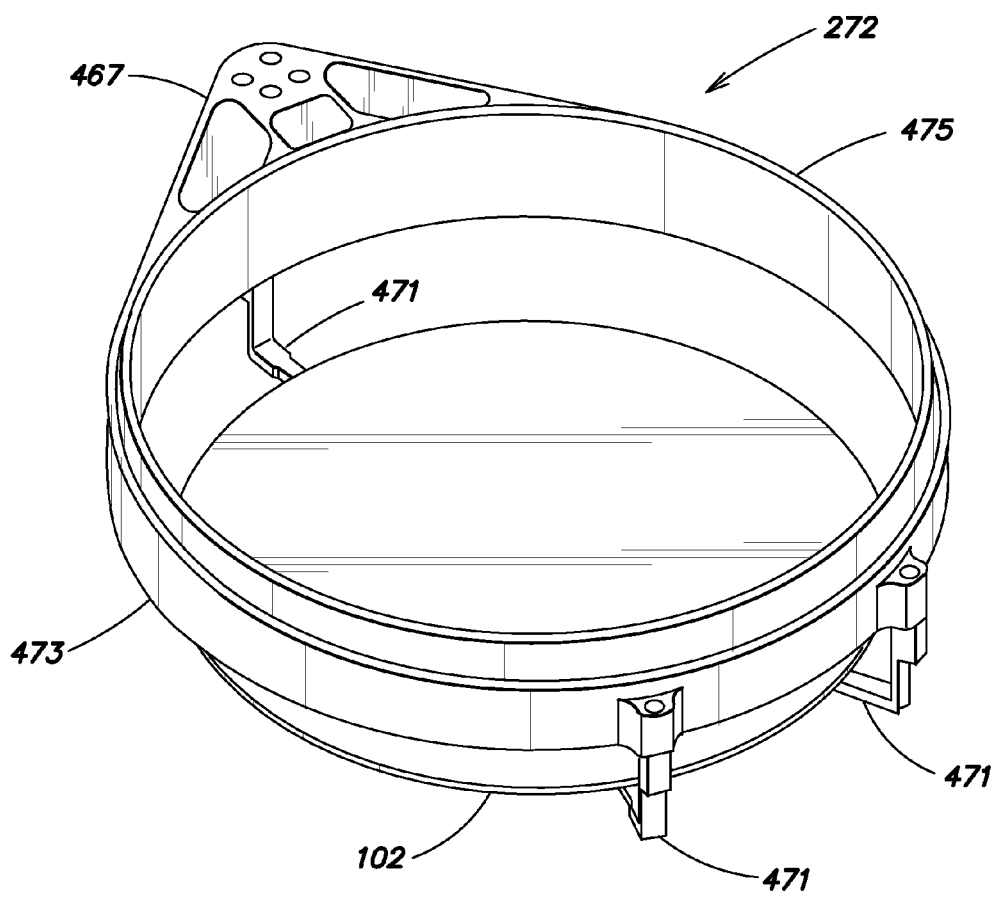
FIG. 4B illustrates an isometric view of a portion of a lift assembly according to embodiments.

Furthermore, a lift assembly 272 may be provided to lift the substrate 102 within the process chambers 252, 352. Lift assembly 272, as best shown in FIG. 4A, includes a lift frame 473, which may be a hoop-shaped frame of an aluminum material. The fingers 471 are coupled to the lift frame 473 and may be attached by suitable fasteners, such as screws or bolts, or made integral with the lift frame 473. The fingers 471 support the substrate 102 and when the lift actuator 482 is actuated to an upper position by the riser portion 470; this positions the substrate 102 to allow the end effector 140A of the robot 112 to extract the substrate 102 from the process chamber 252.

Mounted within the frame 473 is a containment ring 475, which may be a quartz or alumina ring. The containment ring 475 may function to reduce the impact of the slit valve openings 254, 354A, 354B, 454A, 454B on the plasma process taking place within the process chamber 252, 352, 452A, 452B. The containment ring 475 extends between the pedestal 253 and the face plate 259 and fills the vertical gap there between. A radial gap of about 3 mm may be provided between the periphery of the pedestal 253 and an inner diameter of the containment ring 475. Other gaps may be used. Containment ring 475 may be annular in shape, and may rest in a pocket formed in the lift frame 473.

Figure 4C:
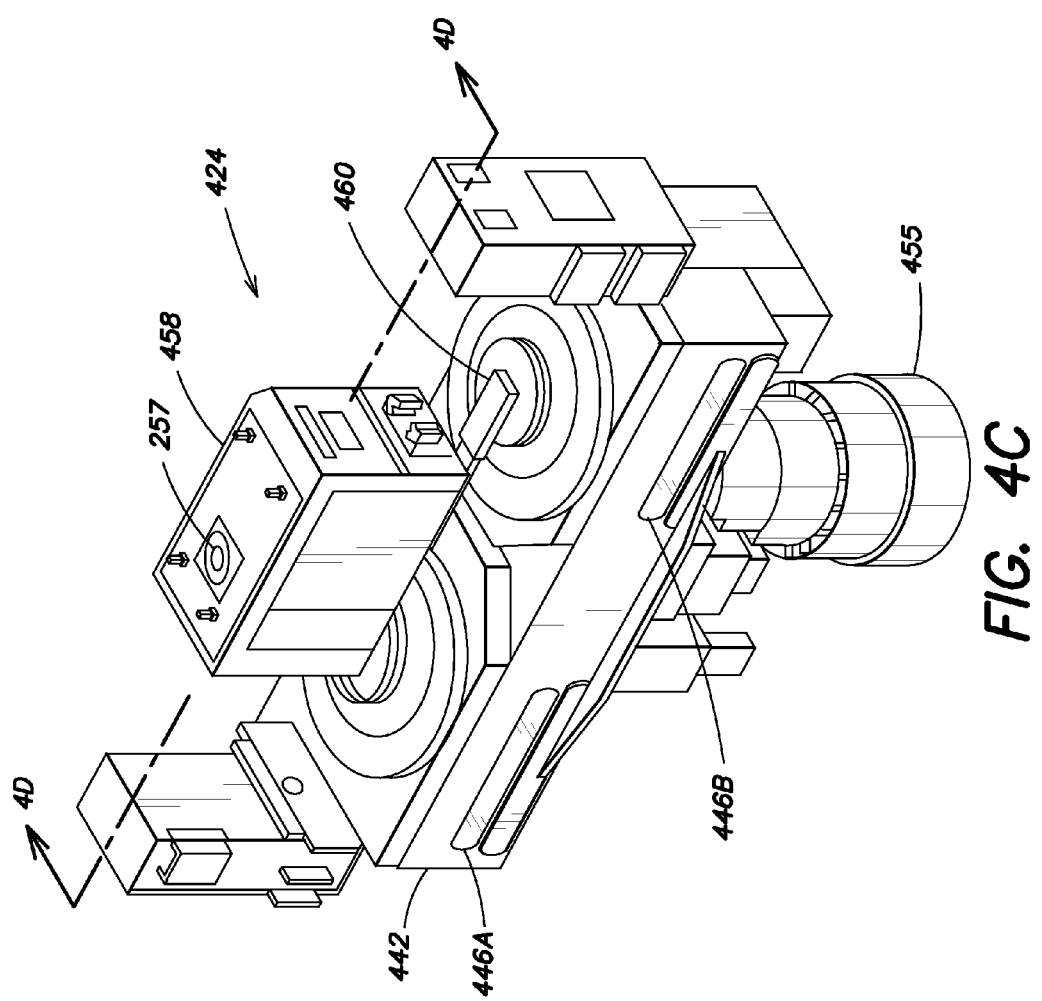
FIG. 4C illustrates an isometric view of a via pass-through assembly according to embodiments.
Figure 4D:
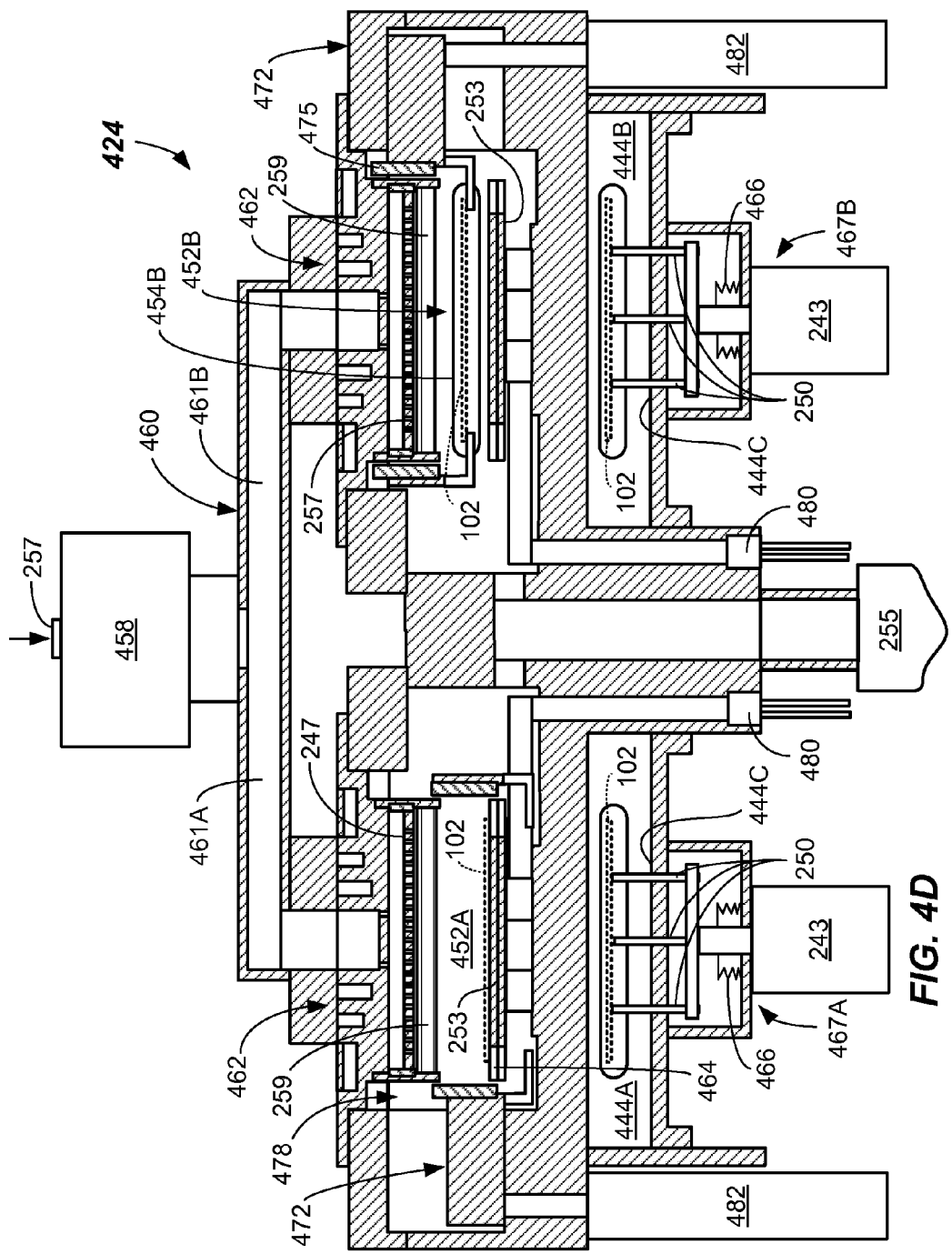
FIG. 4D illustrates a cross-sectional side view of the via pass-through assembly taken along section line 4D-4D of FIG. 4C according to embodiments.

As can be seen in FIG. 4D, the containment ring 475 substantially surrounds the process chamber 452A when the plasma-assisted process is taking place in the chamber 452A. An identical containment ring 475 may be provided in process chamber 452B. When the lift frame 473 is lifted via the action of the riser portion 470 via being actuated by lift actuator 482, the ring 475 moves and is received in annular shaped upper pocket 478 radially outward from the showerhead 247. Accordingly, the ring 475 comprises a moveable containment ring.

FIG. 4D illustrates a representative cross-section of the via pass-through apparatus 424 illustrating the process chambers 452A, 452B and the load lock chambers 444A, 444B and other components. On chamber 452B, the lift assembly 272 is shown positioned in the upper position for exchange. Note that the containment ring 475 is lifted above the slit valve opening 454B so as not to impede exchange of the substrate 102 from the process chamber 452B. The left chamber 452A illustrates the lift assembly 272 in the lower position with the fingers 471 received through the finger recesses 464. Lower lift assemblies 467 are also shown including bellows 466, lower lift actuators 243, supports 450, and cool down platforms 444C.

Electronic device processing system 100 of FIG. 1 includes the via pass-through apparatus 124 having pass-through chambers 122, 123 arranged in a side-by-side arrangement. The pass-through chambers 122, 123 of the via pass-through apparatus 124 may be substantially identical, and may be substituted and replaced by the configuration of via pass-through apparatus 124, 324. In some embodiments, a combination of the type of via pass-through apparatus 124 shown in FIG. 2 may be provided at one via location, and the type of via pass-through apparatus 324 shown in FIG. 3 may be provided at another via location horizontally offset therefrom.

Now referring to FIGS. 4C and 4D, an isometric and cross sectioned view of an embodiment of a pass-through apparatus 424 is illustrated. Via pass-through apparatus 424 includes a common body 442 having entries 446A, 446B coupled to pass-through chambers 444A, 444B that are coupled to and accessible from the first transfer chamber 110. Exits may be provided on the other side and coupled to second transfer chamber 112. As discussed above, the via process chambers 452A, 452B are located above the pass-through chambers 444A, 444B.

As shown in FIG. 4C, a common plasma source 458 may be coupled to each of the process chamber 452A, 452B by a manifold 460. In the depicted embodiment, the via pass-through apparatus 424 includes a common remote plasma source 458 coupled to each of the via process chambers 452A, 452B. The plasma source 458 is referred to as being common in that it produces a plasma in each of the via process chambers 452A, 452B. Distribution channels 461A, 461B couple each of the respective via process chamber 452A, 452B to the common remote plasma source 458. A suitable vacuum pump 455 may be provided underneath the common body 442 and may be used to generate vacuum within the various process chambers 452A, 452B.

As best shown in FIG. 4D, a representative cross-section of the via pass through apparatus 424 illustrating the process chambers 452A, 452B and the load lock chambers 444A, 444B and other components. On process chamber 452B, the lift assembly 472 is shown positioned in the upper position for exchange of a substrate 102. Note that the containment ring 475 is lifted above the slit valve opening 454B so as not to impede substrate exchange in the chamber 452B. The process chamber 452A illustrates the lift assembly 472 located in a lower position with the fingers 471 received through the finger recesses 464. Lower lift assemblies 467A, 467B are also shown including bellows 466, lower lift actuators 243, supports 250, and cool down platforms 444C. Also shown in FIG. 4D is the common remote plasma source 458 coupled to the via process chamber 452A and the via process chamber 452B by manifold 460. Channels 461A, 461B in the manifold 460 deliver plasma to the gas boxes 462 and through the showerhead 247 and face plate 259. One or more gases may be introduced at inlet 257. Auxiliary gas inlets may be provided in the gas box 462 (inlets not shown).

Figure 4E:
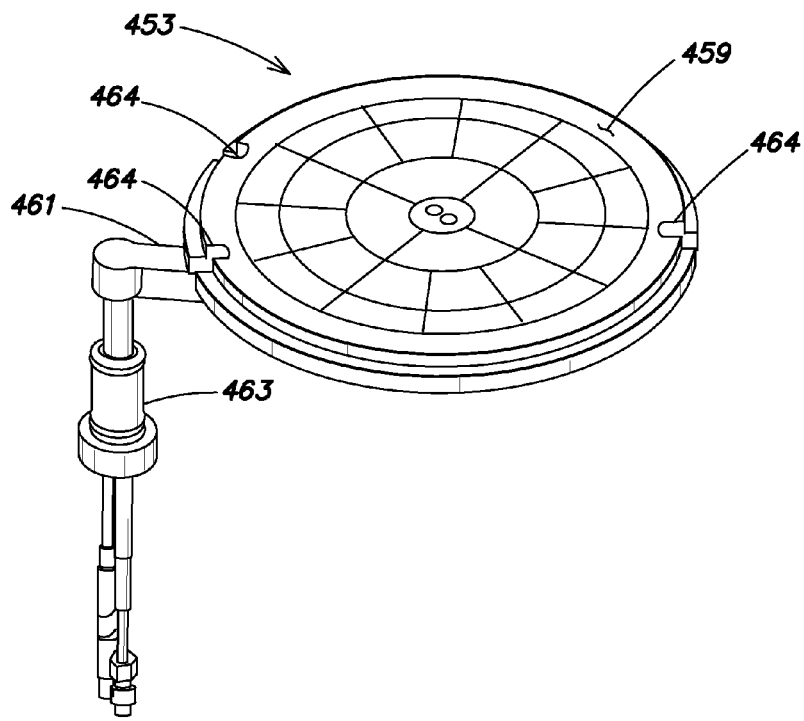
FIGS. 4E and 4F illustrates isometric and cross-sectional isometric view, respectively, of a pedestal according to embodiments.
Figure 4F:
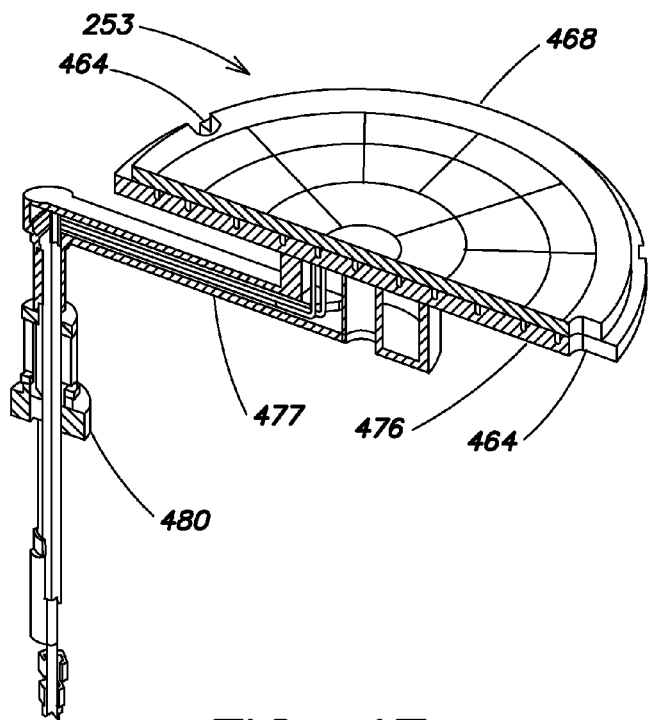

Referring now to FIGS. 4E and 4F, a pedestal 253 is shown in detail. The pedestal 253 includes a top plate 468, which may be an aluminum material adapted to contact the substrate 102. The pedestal 253 may include a support 476 underneath the top plate 468 (which may also be aluminum) and which may include an internal resistive heater having resistive elements laid in grooves in the support 476. The heater may heat the substrate 102 to a suitable processing temperature, such as between about 0 degrees C. and about 300 degrees C., or more. The power input cables to the heater may extend horizontally in a channel 477 and then may extend vertically downward through a heater port formed in the common body 442. Heater port is offset from the center of the top plate 468. A suitable sealed electrical pass through 480 may hermetically seal the heater port. Shown in the top plate 468 are multiple finger recesses 464 that are configured and adapted to receive fingers 471 (e.g., three fingers) below the surface thereof. The fingers 471 of the lift assembly 472 (FIG. 4A-4B) are adapted to contact and lift the substrate 102 during substrate exchange with the robot 116. The fingers 471 may number three or more, for example. Fingers may extend from a connecting portion, such as a lift frame 473 that is connected to the riser portion 470 by a connection flange 467. Fingers may extend horizontally underneath the substrate 102. Fingers 471 may be spaced at appropriate radial intervals to support the substrate 102 yet not impede the end effector 140A access to the substrate 102.

Figure 5:
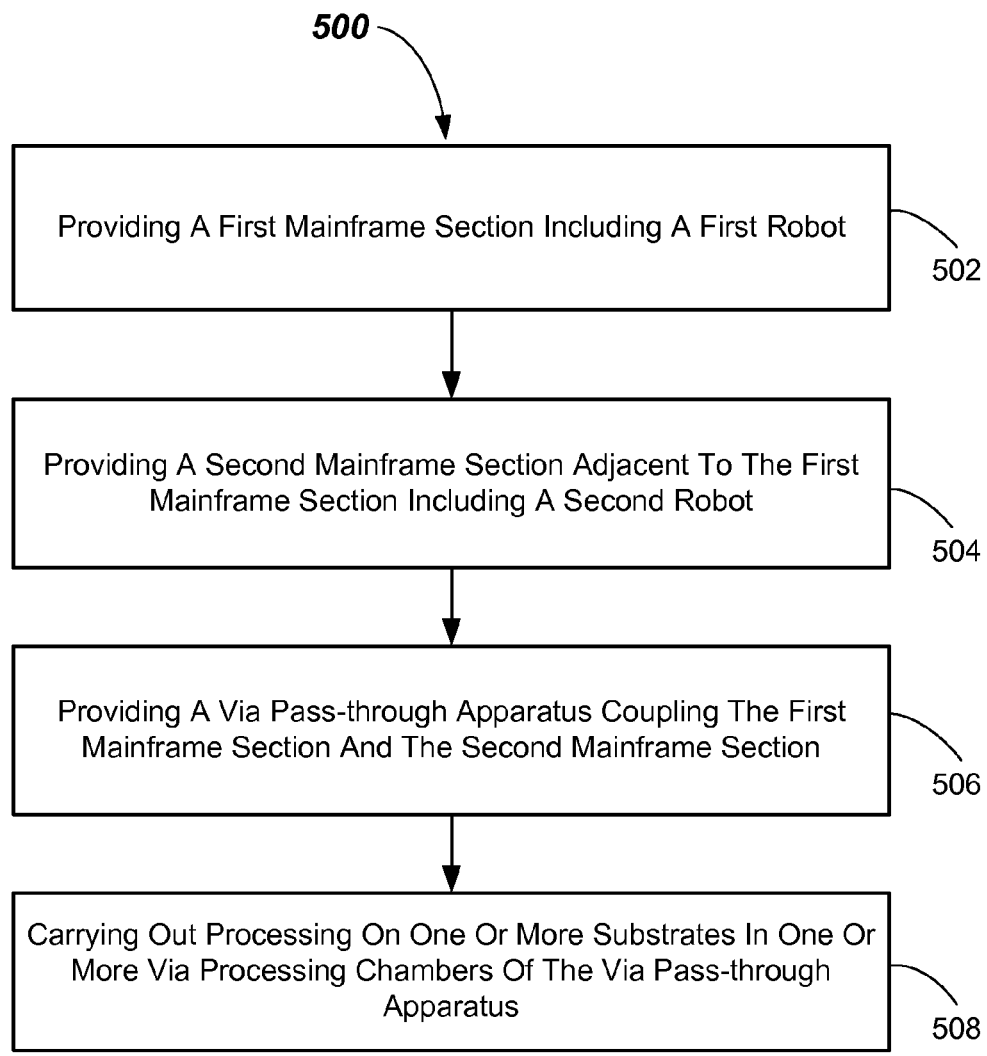
FIG. 5 illustrates a flowchart depicting a method of operating a system including a via pass-through apparatus according to embodiments.

As shown in FIG. 5, a method 500 of processing substrates (e.g., substrates 102) is provided. The method 500 includes, in 502, providing a first mainframe section (e.g., first mainframe section 103) including a first robot (e.g., first robot 114), and, in 504, providing a second mainframe section (e.g., second mainframe section 104) adjacent to the first mainframe section and including a second robot (e.g., second robot 116). The method 500 further includes, in 506, providing a via pass-through apparatus (e.g., via pass-through apparatus 124, 324, 424) coupling the first mainframe and second mainframe, and, in 508, carrying out processing on one or more substrates in one or more via processing chambers (e.g., via processing chambers 252, 352, 452A, 452B) of the via pass-through apparatus.

The foregoing description discloses only exemplary embodiments of the invention. Modifications of the above-disclosed systems, apparatus and methods which fall within the scope of the invention will be readily apparent to those of ordinary skill in the art. Accordingly, while the present invention has been disclosed in connection with exemplary embodiments thereof, it should be understood that other embodiments may fall within the scope of the invention, as defined by the following claims.

The invention claimed is:

1. An electronic device processing system, comprising:
a first mainframe section including a first housing defining a first transfer chamber and one or more process chambers coupled to the first housing and including a first robot configured to move substrates;
a second mainframe section including a second housing defining a second transfer chamber and one or more process chambers coupled to the second housing and including a second robot configured to move substrates;
a via pass-through apparatus coupled between the first mainframe and the second mainframe, the via pass-through apparatus providing the only entrance to and exit from the second mainframe section including:
a first pass-through chamber coupled between the first mainframe and the second mainframe, wherein the first pass-through chamber is accessible by both the first robot and the second robot, and
a via process chamber adapted to carry out a process on a substrate, the via process chamber located at a different level than the first pass-through chamber, the via process chamber comprising a lift assembly to lift a substrate within the via process chamber, the lift assembly including a hoop-shaped lift frame, a lift actuator coupled to and positioned beneath the lift frame, and a plurality of fingers coupled to the periphery of the lift frame and extending beneath the lift frame to support the substrate; and
one or more load lock chambers coupled to the first housing of the first mainframe section on a side of the first mainframe section opposite from the via pass-through apparatus.

2. The electronic device processing system of claim 1, wherein the process comprises at least one selected from a deposition process, an oxidation process, an oxide removal process, a nitration process, an etching process, annealing process, and a cleaning process.

3. The electronic device processing system of claim 1, wherein the process comprises an abatement process.

4. The electronic device processing system of claim 1, wherein the via pass-through apparatus comprises a second pass-through chamber, the first pass-through chamber arranged in a side-by-side arrangement with the second pass-through chamber.

5. The electronic device processing system of claim 1, wherein the via pass-through apparatus comprises only a single entry into the via process chamber.

6. The electronic device processing system of claim 1, wherein the via pass-through apparatus comprises:
   a first entry into the via process chamber from the first mainframe, and
   a second entry into the via process chamber from the second mainframe.

7. The electronic device processing system of claim 1, wherein a containment ring is mounted within the lift frame.

8. The electronic device processing system of claim 7, wherein the containment ring has an annular shape, rests in a pocket formed in the lift frame, and surrounds an interior volume of the via process chamber.

9. The electronic device processing system of claim 1, wherein the via process chamber comprises only one opening adapted to couple to one of the first mainframe section or the second mainframe section.

10. The electronic device processing system of claim 1, comprising a second via process chamber arranged in a side-by-side arrangement with the via process chamber.

11. The electronic device processing system of claim 1, comprising a common remote plasma source coupled to the via process chamber and a second via process chamber.

12. The electronic device processing system of claim 11, comprising distribution channels coupling the common remote plasma source coupled to the via process chamber and a second via process chamber.

* * * * *